United States Patent

Hayashi et al.

[11] Patent Number: 6,064,235
[45] Date of Patent: May 16, 2000

[54] SHARED PATH PHASE DETECTOR

[75] Inventors: Masayuki Hayashi, Sunnyvale, Calif.; Robert J. Savaglio, Jericho, Vt.

[73] Assignee: International Business Machines Corporation, Armonk, N.Y.

[21] Appl. No.: 09/045,981

[22] Filed: Mar. 18, 1998

[51] Int. Cl.[7] ................................................ G01R 29/00
[52] U.S. Cl. ...................... 327/2; 327/7; 327/10
[58] Field of Search ................................ 327/2, 3, 7, 10, 327/12

[56] References Cited

U.S. PATENT DOCUMENTS

| | | | |
|---|---|---|---|
| 4,246,497 | 1/1981 | Lawson et al. | 327/12 |
| 5,105,160 | 4/1992 | Summers | 327/7 |
| 5,150,068 | 9/1992 | Kawashima et al. | 327/145 |
| 5,266,851 | 11/1993 | Nukui | 327/3 |
| 5,329,559 | 7/1994 | Wong et al. | 375/119 |
| 5,491,439 | 2/1996 | Kelkar et al. | 327/157 |
| 5,530,383 | 6/1996 | May | 327/39 |
| 5,546,052 | 8/1996 | Austin et al. | 331/1 A |

*Primary Examiner*—Timothy P. Callahan
*Assistant Examiner*—Hai L. Nguyen
*Attorney, Agent, or Firm*—Mark F. Chadurjian

[57] ABSTRACT

A shared path phase detector circuit for receiving a reference clock and an oscillator clock, the phase detector circuit providing an output signal for indicating a magnitude difference between a phase of the reference and oscillator clocks. The output signal is independently derived from the leading or lagging edge relationship of the reference and oscillator clocks. The output signal does not describe which signal leads, but only the width magnitude difference. The design provides a single path over which the output signal travels, without feedback, such that the circuit dependencies are greatly reduced.

12 Claims, 4 Drawing Sheets

SHARED PATH PHASE DETECTOR

FIELD OF THE INVENTION

The present invention relates to the design and manufacture of ASIC (Application specific integrated circuit) chips and microprocessor chips. More specifically, the present invention relates to the design of the clocking circuit provided internal to the ASIC chip for synchronizing and controlling the sequential operations of the chip.

BACKGROUND OF THE INVENTION

In the design and manufacture of ASIC (application specific integrated circuit) chips and microprocessor chips, it is conventional practice to provide the chip designer with a library of conventional circuits from which to generate the design. Thus, the circuit designs from which the designer must choose are fixed, and also the rules for interconnecting the circuits by wiring are fixed.

Conventionally, one of the circuits used by a chip designer is a phase locked loop (PLL) circuit. PLLs are used to perform two or three different functions. One principal function is to lock or align the output clock of a circuit with the clock input. A second function is to multiply (i.e., increase) or divide (i.e., decrease) the output frequency of a circuit with respect to the input frequency. A third function is to provide clock recovery, i.e., to attenuate the input jitter associated with input signals and recover the clock from jittery data.

The present invention provides improvement over the prior art, which is better understood by first considering the prior art. Referring to FIG. 1, a block diagram of a phase locked loop (PLL) circuit according to the prior art is shown. The circuit includes a phase/frequency detector 10 which receives a reference clock input and compares the reference clock input frequency with an output clock signal. The phase/frequency detector 10 also receives as an input a pulse of a feedback divider/pulse generator 12, which provides for frequency multiplication in a well-known manner. The strobe pulse is used within the phase/frequency detector 10 to mask the output clock to accomplish frequency division without delay associated with the feedback divider 12, since the phase/frequency detector is comparing a masked feedback signal directly from the clock output and not from the feedback divider/pulse generator 12. Generally, the feedback from the clock tree 30, the feedback divider 12 and the reference clock are used to align the output clock (i.e., clock tree 30). The phase/frequency detector 10 will output increment (INC) and decrement (DEC) pulses to charge pumps 14 and 16.

The phase/frequency detector 10 is a rising edge detector. It compares the rising edge of the clock reference signal and rising edge of PLL output clock. FIG. 2 shows the creation of the INC and DEC outputs of typical prior art phase/frequency detectors. When the output clock phase falls behind or lags the reference clock phase, increment (INC) pulses are generated. The width of this pulse t1 is equal to the timing difference between the rising edges of the reference clock and output clock. When output clock phase is ahead of or leads the reference clock phase decrement (DEC) pulses are generated. The width of this DEC t2 pulse equals the timing difference between the rising edges of the output clock and reference clocks. Due to the speed limitations of the phase/frequency detector circuits, no INC or DEC signals will be generated when reference clock and output clock phases align perfectly within a small delta value of each other. When this delta value is around zero, the detector phase crossing is known as "dead zone," because the detector is functionally "dead" in this region. That is, a "dead zone" is a special case where the phases of the two clock inputs to the phase detector circuit align within a very small delta and cause the two phase detector outputs to go "dead," meaning that there is not a pulse on either output.

Charge pumps 14, 16 will generate current pulses equal in width to INC and DEC pulses. INC will add charge to a differential loop filter 18 comprising a pair of capacitors, and DEC will subtract charge from the filter 18. Charge pump 14 outputs a current signal to filter 18 and either increases or decreases the charge to filter 18, depending upon whether the signal is to increment or decrement the frequency. The increment/decrement signal is also supplied to the second charge pump 16 which converts the increment/decrement signal to a current output which is fed forward to a differential current controlled oscillator 20 which changes its output frequency in response to change in input current. The use of charge pump 16 which supplies current to the oscillator 20 eliminates the need for a resistor coupled to the capacitors of the filter 18. In effect, this performs the differentiation function normally accomplished by such a resistor. Thus, if the output clock is earlier in phase than the reference clock, the phase/frequency detector 10 generates a decrement pulse, and the charge pumps 14, 16 convert this logic signal to current pulses. The pulse from charge pump 14 decreases the voltage across filter 18. Conversely, if the output clock signal is later in phase than the reference clock, the phase frequency detector 10 generates an increment pulse that the charge pump 14 uses to increase the voltage across the filter 18. The filter 18 converts the current from the first charge pump 14 to voltage. In essence, the filter 18 and the charge pump 16 smooth the pulses from pulse generator in order to provide smooth DC voltage to current converter 22.

The output voltage from the filter 18 is supplied as input to the voltage to current converter 22 of conventional design wherein the voltage is converted to current as an output in a well-known manner. The output current from the voltage to current converter 22 is supplied to the differential current controlled oscillator 20 along with the output from the charge pump 16. These two inputs are summed by the current controlled oscillator 20 to provide a differential output, the frequency of which depends upon the value of the current outputs of voltage to current converter 22 and the second charge pump 16. The differential voltage output of the differential current controlled oscillator 20 is supplied to CMOS converter 24 of conventional design which converts the differential voltage output of this oscillator 20 to a single ended output of the desired frequency. The output of the CMOS converter 24 is supplied to a forward frequency divider and buffer 26, of conventional design, which provides a signal having the desired multiple of the input clock frequency as input to a clock distribution tree 30.

The clock distribution tree 30 is a series of clock circuits designed and utilized by the chip designer to perform various clocking functions that are required. In the case of ASIC chips there may be several chips used each of which requires the same clock timing signals. Since processing variables may tend to introduce different delays from chip to chip in the clock distribution tree, the output from the clock distribution tree rather than the output from forward divider and buffer 26 is used as the input to the phase/frequency detector 10 so as to provide the proper phase alignment in all of the chips running from the same clock irrespective of different delays in different chips. The output from the clock distribution tree is also used as input to feedback divider and buffer 12, of conventional design, which functions as a frequency multiplier for the output from the phase/frequency detector 10.

In order to control the frequency multiplication ratio as well as control the gain of the charge pump 16, a control circuit 36 is provided which provides signals to a decoder 38. The decoder 38 provides signals to charge pump 16 and dividers 26, and 12 to set the frequency multiplication ratios of the circuit in a well known manner. A jitter control circuit 42 is also provided, which will be described in detail presently, and which receives as input the output signal from the phase/frequency detector 10 and controls outputs to the charge pumps 14, 16 to reduce jitter. The lock indicator 44 receives input from the phase/frequency detector 10 and the clock reference signal and outputs a "locked" signal. Finally an initialization circuit 46 is provided which will initialize the circuit in a stable range for proper phase locking by supplying a proper charge to the filter 18 in a well-known manner.

The phase/frequency detector 10 is configured to receive an output signal A from the clock tree 30 and an output signal B from the feedback divider 12 and, using these signals, detects the phase difference with respect to the reference clock, and outputs the necessary increment and decrement signals. Both signals (clock tree 30 output and feedback divider 12 output B) are used, since the output frequency is a multiple of the input frequency, and the feedback divider, while outputting a signal matching the frequency of the input signal introduces a delay. Hence, the phase of the output of the feedback divider 12 lags the phase of the output signal from the clock tree 30. The phase/frequency detector 10 includes circuitry which masks the output signals from the clock tree so as to have unmasked rising or falling edges of this pulse match the frequency of the rising or falling edges of reference clock input.

Referring to FIG. 3, the two output signals A and B from FIG. 1 are inputted to NAND gate 110, and the gate 110 outputs signal $\overline{C}$. The reference clock signal, denoted as REF, is inputted to NAND gate 111. The output of gate 110 is the signal whose phase is to be compared with the phase of the signal from gate 111. The remainder of the circuitry performs this phase comparison in a manner which is generally well known. The output from the gate 110 is supplied as one input to NAND gate 112 and also as one input to NAND gate 114. The output from gate 114 is inputted to NAND gate 116 which outputs a signal to inverters 118 and 120. Gate 116 and inverters 118 and 120 act as a delay circuit 121. The output from inverter 120 is inputted to NAND gate 122 as well as to gate 112, and also to NAND gates 124 and 126. The output from gate 114 is also one input to gate 124 the output of which is one input to gate 114. The output from gate 126 is one input to NAND gate 128 the other input of which is from the output of gate 111.

The output of gate 122 is inputted into inverter 132 which generates an increment (INC) signal and the output of the inverter 132 is inputted to inverter 134 which generates an inverted increment signal referred to as the increment not signal (INCN). Similarly, the output of gate 112 is inputted into inverter 136 which outputs a decrement signal (DEC) and the output of inverter 136 is also inputted into inverter 138 which inverts the decrement signal to produce a signal referred to as the decrement not (DECN) signal. It is the INC and DEC signals that are used to actuate the charge pumps 14 and 16. Since the charge pumps are differential the "NOT" signals are also necessary as is well known for differential circuits. It is the durations of the INC or DEC pulses that control the time the charge pumps 14, 16 output current.

Conventionally, the PLL circuit is an analog circuit which can be used in digital technology wherein substrate noise is generated. It is necessary in the design of ASIC chips to compensate for delays that might be induced in clock distribution trees. It is also necessary to compensate for any delays that might be induced by dividers in the feedback portion of the circuit. Feedback dividers are used when frequency is being multiplied, which often occurs when the signal being received comes from a relatively low frequency source. The design of the PLL usually requires a custom design or several iterations of manual circuit library placement and wiring in order to obtain a matched loading on an increment path and a decrement path. If some loading difference exists between the two paths, then the increment output pulse width and the decrement output pulse width will not reflect the true input phase differences. In this case the PLL output frequency will wander away, and this is a source of PLL jitter. The present invention solves this problem such that the increment and decrement paths share a common circuit path and cannot experience different loadings and delays. In addition, since the increment path and the decrement path share the same devices, there is no static jitter factor associated with this invention.

In U.S. Pat. No. 5,546,052, "Phase Locked Loop Circuit with Phase/Frequency Detector which Eliminates Dead Zones" by Austin et al., the prior art type of phase detector (PHD) circuit described above is disclosed having two output paths, increment (INC) and decrement (DEC), where the PLL includes a phase/frequency divider circuit and feedback from a clock distribution tree to generate INC and DEC pulses. A pair of charge pumps receives the INC and DEC pulses and a jitter control circuit is also provided which reduces jitter in the current controlled oscillator output in the locked phase. The PLL circuit eliminates "dead zones" by having equal pulses on both outputs rather than having no pulses.

In U.S. Pat. No. 5,491,439, "Method and Apparatus for Reducing Jitter in a Phase Locked Loop Circuit" by Kelkar et al., the prior art type of phase detector (PHD) circuit described above is disclosed having two output paths, increment (INC) and decrement (DEC), where the PLL includes a phase/frequency divider circuit and feedback from a clock distribution tree to generate INC and DEC pulses. A pair of charge pumps receives the INC and DEC pulses, and a jitter control circuit is also provided which reduces jitter for the oscillator output in the locked phase. Kelkar, in an identical manner to Austin, improves the basic PLL circuit by eliminating "dead zones."

In U.S. Pat. No. 5,329,559, "Phase Detector for Very High Frequency Clock and Data Recovery Circuits" by Wong et al., Wong teaches the prior art type of phase detector (PHD)circuit described above having two output paths, increment (INC) and decrement (DEC). The positive and negative incremental outputs of the PHD circuit are integrated or averaged to eliminate problems associated with any duty cycle distortion and/or jitter in the generated clock. Also, serial data signal input to the phase detector circuit is recovered in addition to the feedback clock. The data is recovered using a second parallel circuit, so that the recovered data is time synchronized. The recovered data signal is derived from signals in the phase detector path, eliminating the need for two distinct circuits for data recovery and clock recovery.

It is an object of the present invention to provide a shared path phase detector circuit suitable for use in ASIC and microprocessor chips that is versatile and generates an output signal for indicating the magnitude of the phase difference between the reference and oscillator clocks.

It is a further object of the present invention to provide a shared path phase detector circuit with an output signal which is independent of which input clock signal leads or lags the other clock.

It is a further object of the present invention to provide a shared path phase detector circuit that generates an output signal having a single internal path, without feedback, such that the circuit dependencies are greatly reduced.

It is a further object of the present invention to reduce the static jitter by having the increment and decrement paths share the same circuits.

SUMMARY OF THE INVENTION

Accordingly, the present invention provides a phase detector circuit (PHD) comprising a first clock input for receiving a first clock input signal, a second clock input for receiving a second clock input signal, a comparator for comparing said first and second clock input signals to detect the difference in phase between said first and second clock input signals, and a shared path for outputting a first output signal including at least one pulse having a width proportional to said difference in phase.

The present invention also provides an integrated circuit comprising a phase detector circuit including a first clock input for receiving a first clock input signal, a second clock input for receiving a second clock input signal, a comparator for comparing said first and second clock input signals to detect the difference in phase between said first and second clock input signals, and a shared path for outputting a first output signal including at least one pulse having a width proportional to said difference in phase.

The advantages of this invention will become apparent from the following detailed description of the presently preferred embodiment of the invention, taken in conjunction with the accompanying drawings.

DETAILED DESCRIPTION OF A PREFERRED EMBODIMENT OF THE INVENTION

In accordance with the invention, a shared path phase detector circuit is provided for receiving a reference clock and an oscillator clock from an adjustable oscillator. The phase detector (PHD) circuit provides a single output signal or path, i.e., shared path, for indicating the magnitude of the phase difference between the reference and oscillator clocks. In other words, the increment and decrement paths of the prior art are shared. The output signal is independently derived from the leading or lagging edge relationship of the reference and oscillator clocks. The output signal does not describe which signal leads, but only the magnitude of the phase difference.

Figure 1:
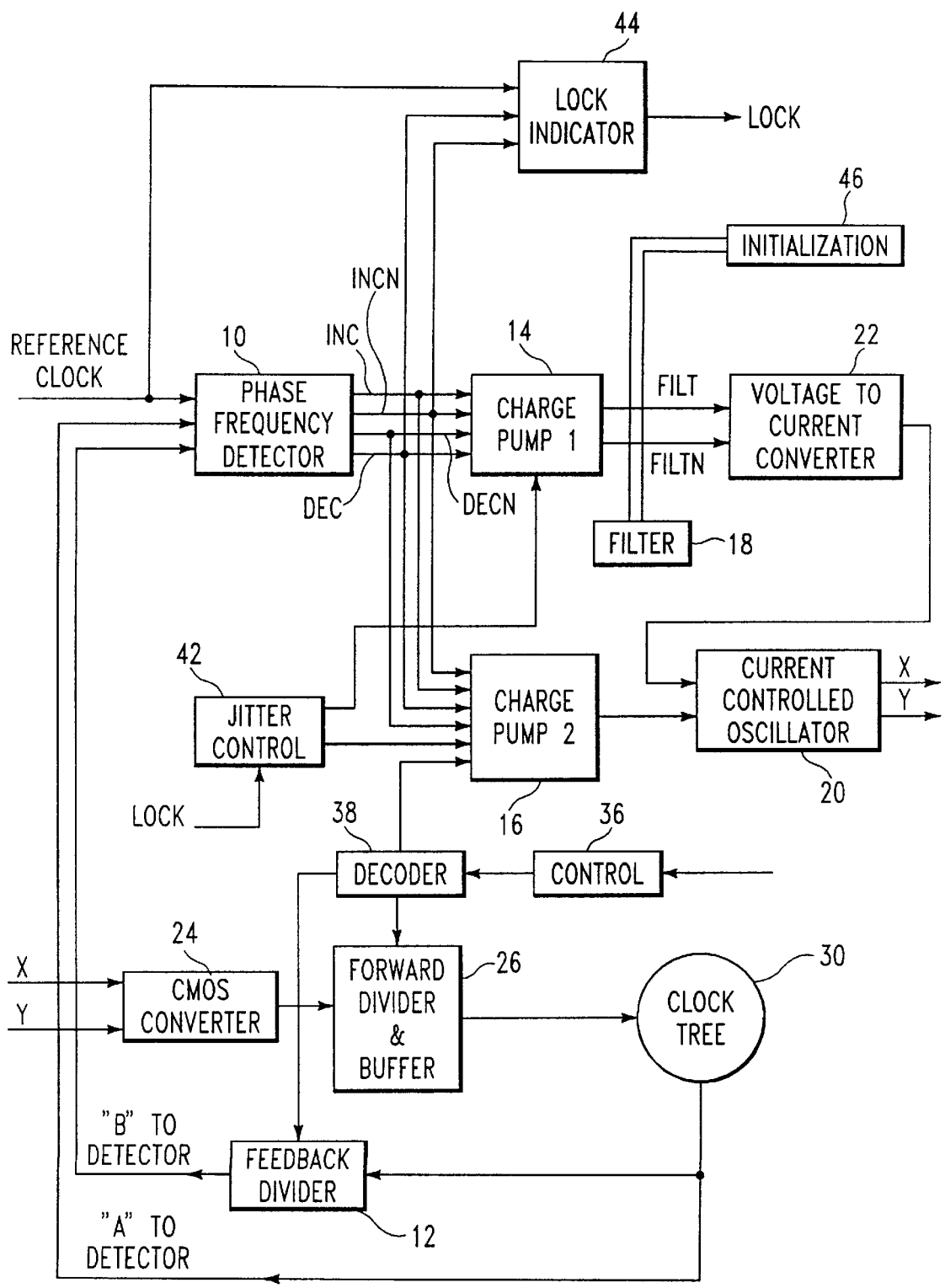
FIG. 1 is a high level block diagram showing a prior art phase locked loop circuit.
Figure 2:
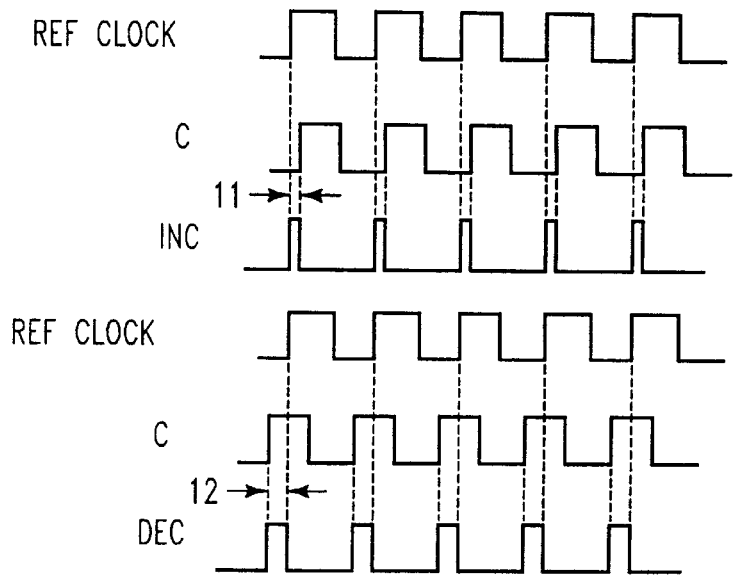
FIG. 2 is a graphical representation of the increment and decrement pulse outputs of the phase detector circuit according to FIG. 3.
Figure 3:
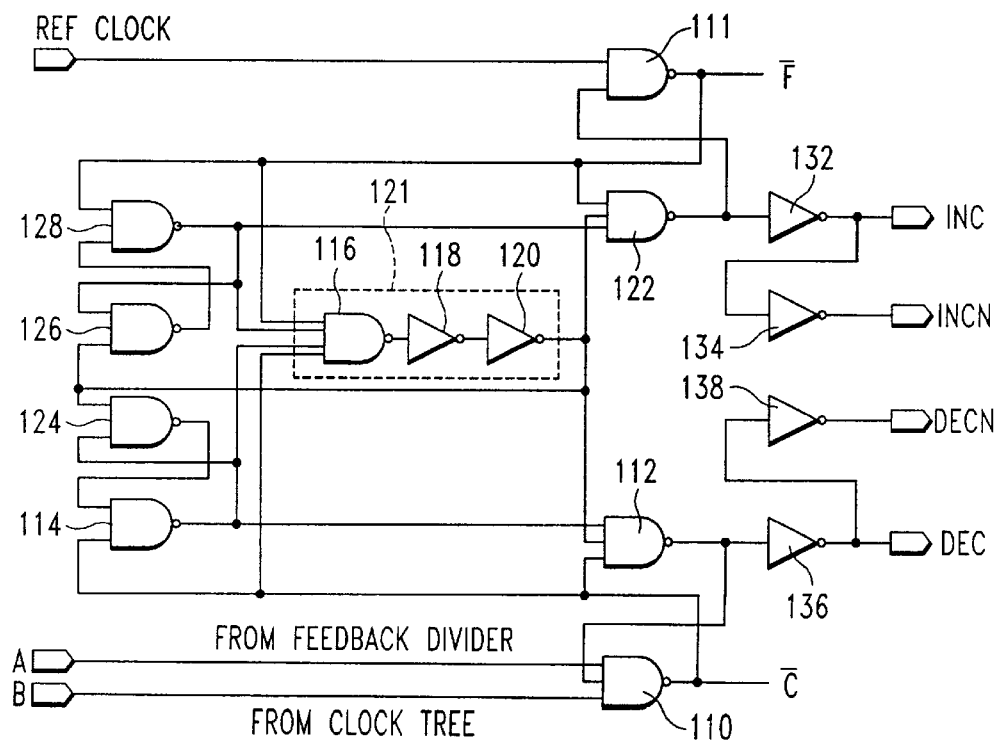
FIG. 3 is a circuit diagram showing the circuitry of a prior art phase detector circuit.
Figure 4:
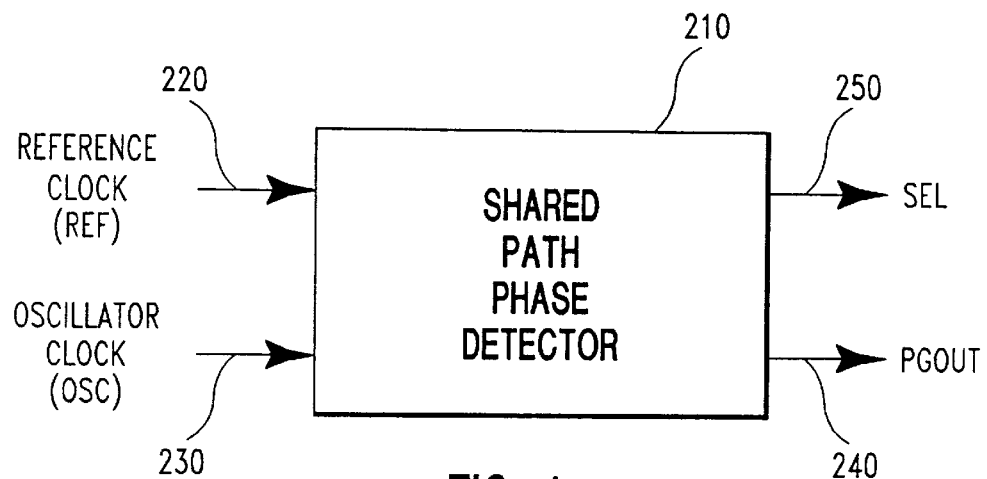
FIG. 4 shows a block diagram of the input and output signals to a shared path phase detector circuit according to the present invention.

Referring to FIG. 4, shared path phase detector 210 is shown to receive two clock inputs, reference clock 220 and oscillator clock 230 of the same frequency. The first output of PHD 210 is the PGOUT 240 signal, which provides a signal for indicating the magnitude difference in phase between the reference 220 and oscillator 230 clocks. The PGOUT signal 240 is independently derived from the leading or lagging edge relationship of the reference 220 and oscillator 230 clocks. The phase detector circuit 210 is further comprised of a second output signal 250, called select (SEL 250), which is used to determine the periods of time during which the first output signal 240 contains valid pulses.

Figure 5:
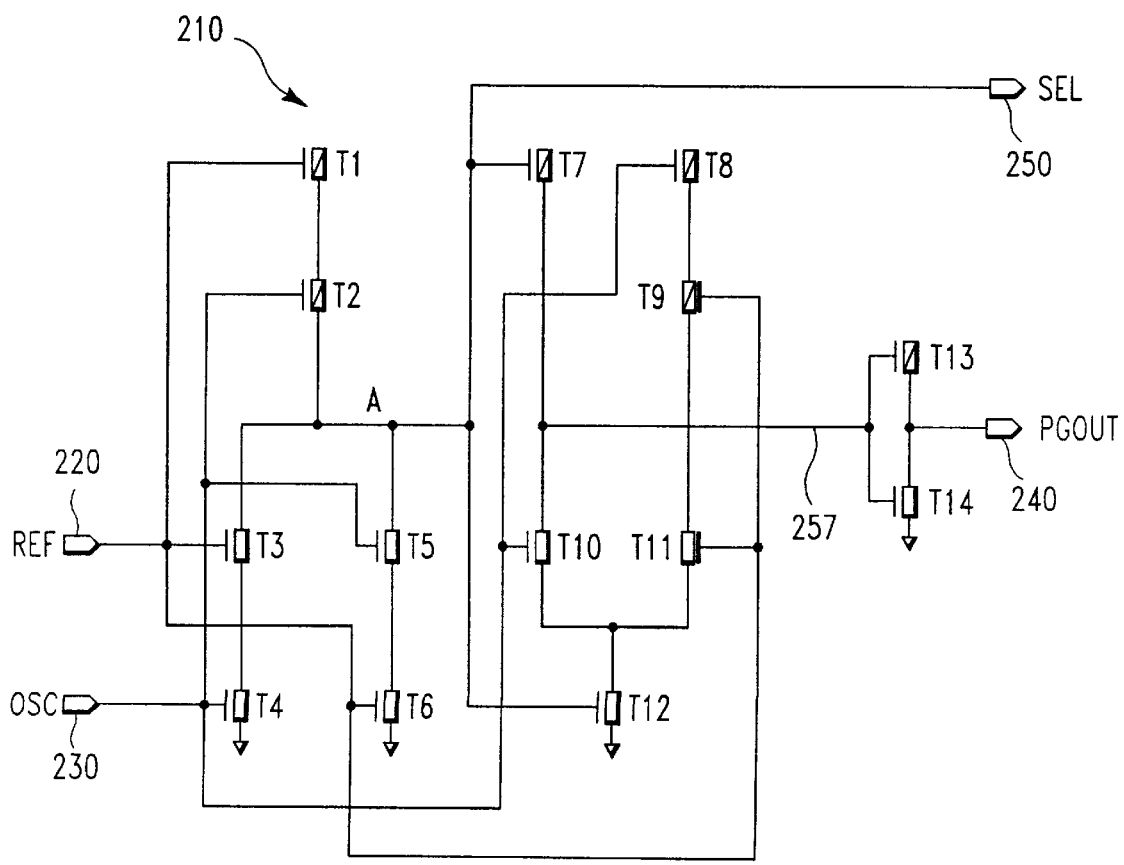
FIG. 5 shows a circuit diagram of a shared path phase detector circuit according to the present invention.

Referring to FIG. 5, a more detailed circuit diagram is shown of shared path PHD 210. PHD 210 is comprised of 14 Field Effect Transistors (FETs) labeled T1 to T14. FETs are well known to those associated with the art of ASIC design. FETs T1–T6 detect the case where REF 220 and OSC 230 are both a logic zero (0) or low, at the same time waiting for the rise of either clock 220, 230. The detection of both clocks equal to logic 0 turns off FETs T1–T6 and sets SEL 250 signal to active high or a logic one (1). SEL 250, being active, turns on T12 and turns off T7. T10 and T11 are also off at this time, but T8 and T9 are on and cause path 257 to go to logic 1 driving PGOUT through inverter T13, T14 to a logic 0. If OSC 230 rises first (leads REF 220), SEL 250 stays at logic 1. OSC 230 goes to logic 1 and turns T10 on. In this case, path 257 goes to logic 0. T13, T14 invert the path 257 signal, so that PGOUT 240 goes to logic 1. In the other case, if the REF 220 clock rises first (leads the OSC 230), SEL 250 stays at logic 1. REF 220 goes to logic 1, turning T11 on. In this case, path 257 goes to logic 0. T13, T14 invert the path 257 signal, so that PGOUT 240 goes to logic 1. When both clocks 220, 230 are logic 1s or high, SEL 250 goes to logic 0 and stays at 0 until one of the clocks returns to logic 0, as controlled by FETs T1–T6. SEL 250, being logic 0, turns T7 on, thus completing pulse with transformation, and turns T12 off and holds path 257 to logic 1 (PGOUT to logic 0). Thus, FETs T7–T12 sense the magnitude of the phase difference between clocks 220 and 230, regardless of whether OSC 230 is leading or lagging REF 220. The magnitude of the phase difference is sent over a single path 257 to FETs T13 and T14 to be inverted and driven as the first output signal, PGOUT 240.

Figure 6:
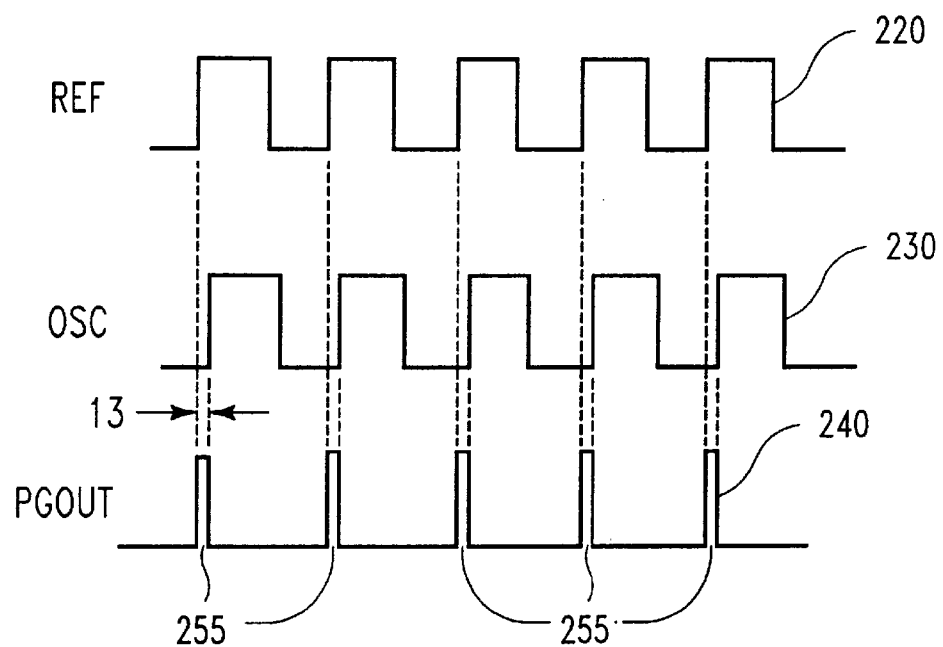
FIG. 6 is a timing diagram for the output signal of a shared path phase detector circuit according to the present invention showing that the width of the output signal is proportional to the phase difference by which the reference clock leads the oscillator clock.

Referring to FIG. 6, a timing diagram for the first output signal (PGOUT 240) of the shared path phase detector circuit 210 is shown. FIG. 6 shows the width magnitude of the PGOUT signal 240 is proportional to the phase difference by which the reference clock 220 leads the oscillator clock 230. The rising edge of reference clock (REF 220) is shown to lead the rising edge of oscillator clock (OSC 230) by an amount of time t3. PHD 210 generates the PGOUT 240 signal based on the t3 time difference in the rising edges of REF 220 and OSC 230. The magnitude (pulse width) of pulse 255 generated on the PGOUT 240 signal is proportional to the difference in phase t3 by which reference clock 220 leads OSC clock 230. Thus, the pulse 255 on PGOUT 240 has a pulse width equal to t3 in this case.

Figure 7:
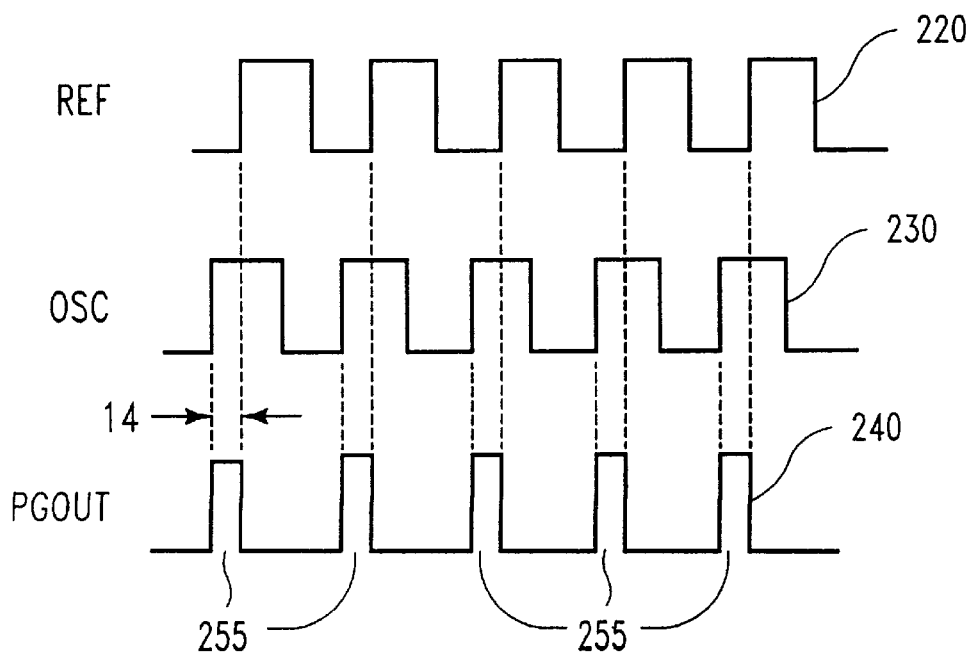
FIG. 7 is a timing diagram for the output signal of a shared path phase detector circuit according to the present invention showing that the width of the output signal is proportional to the phase difference by which the oscillator clock leads the reference clock.

Referring to FIG. 7, a timing diagram for the first output signal 240 of the shared path phase detector circuit 210 is shown. FIG. 7 shows the width magnitude of the output signal is proportional to the phase difference by which the oscillator clock 230 leads the reference clock 220. The rising edge of oscillator clock (OSC 230) is shown to lead the rising edge of reference clock (REF 220) by an amount of time t4. PHD 210 generates the PGOUT 240 signal based on the t4 time difference in the rising edges of OSC 230 and REF 220. The magnitude (pulse width) of pulse 255 generated on the PGOUT 240 signal is proportional to the difference in phase t4 by which oscillator clock 230 leads reference clock 220. Thus, the pulse 255 on PGOUT 240 has a pulse width equal to t4 in this case.

FIGS. 6 and 7 show that whether REF 220 leads or lags OSC 230, the PHD 210 generates pulses 255 on the PGOUT 240 signal which are proportional to the lead and lag times t3 and t4; i.e., the phase difference indicated by t4 in the example shown in FIG. 7 is larger than the phase difference indicated by t3 in the example shown in FIG. 6; therefore, pulse 255 has a larger magnitude t4 in FIG. 7 than the comparable pulse 255 having magnitude t3 in FIG. 6.

The phase detector circuit 210 is self-initializing and does not require a reset to be initialized. The self-initializing consists of one of the first and second clock input signals always existing as, a continuous waveform. This approach precludes any initialization condition whereby one of the two clock input signals are stuck at a logical one and the other stuck at a logical zero.

The shared path phase detector 210 is particularly applicable for providing a clocking system for an ASIC (application specific integrated circuit) chip. It is simple, has fewer devices, requires less power, provides quick design turn around time, and has fewer static and dynamic jitters than the prior art phase detector. One will appreciate, however, that shared path phase detector 210 may have other applications within the scope of the present invention.

A single path 257 is provided for the PGOUT 240 output signal over which pulses are transmitted for indicating the magnitude of the phase difference between the input clocks. The single path 257 is without feedback loops, load balancing, or wire routing restrictions, such that the circuit dependencies are greatly reduced.

It will be appreciated that, although the specific embodiment of the invention has been described herein for purposes of illustration, various modifications may be made without departing from the spirit and scope of the invention. Accordingly, the scope of protection of this invention is limited only by the following claims and their equivalents.

What is claimed is:

1. A phase detector circuit (PHD) comprising:

a first clock input for receiving a first clock input signal;

a second clock input for receiving a second clock input signal;

a comparator for comparing said first and second clock input signals to detect a difference in phase between said first and second clock input signals; and a shared path for outputting a first output signal including at least one pulse having a width proportional to said difference in phase between said first and second clock input signals, and a second output signal which indicates whether said at least one pulse of said first output signal is valid.

2. The PHD, as recited in claim 1, wherein said comparator detects the rising edges of both said first and second clock input signals and generates said first output signal.

3. The PHD, as recited in claim 1, wherein said pulse increases in width when said difference in phase between said first and second clock input signals increases and wherein said pulse decreases in width when said difference in phase between said first and second clock input signals decreases.

4. The PHD, as recited in claim 1, wherein said width of said first output signal pulse is independent of whether the phase of said second clock input signal is leading or lagging the phase of said first clock input signal.

5. The PHD, as recited in claim 1, wherein the PHD is self-initializing.

6. The PHD, as recited in claim 1, wherein said first clock input signal is a clock reference signal and said second clock input signal is an oscillator clock signal.

7. An integrated circuit comprising a phase detector circuit including:

a first clock input for receiving a first clock input signal;

a second clock input for receiving a second clock input signal;

a comparator for comparing said first and second clock input signals to detect a difference in phase between said first and second clocks; and a shared path for outputting a a first output signal including at least one pulse having a width proportional to said difference in phase between said first and second clock input signals, and a second output signal which indicates whether said at least one pulse of said first output signal is valid.

8. The integrated circuit, as recited in claim 7, wherein said comparator detects the rising edges of both said first and second clock input signals and generates said first output signal.

9. The integrated circuit, as recited in claim 7, wherein said pulse increases in width when said difference in phase between said first and second clock input signals increases and wherein said pulse decreases in width when said difference in phase between said first and second clock input signals decreases.

10. The integrated circuit, as recited in claim 7, wherein said width of said first output signal pulse is independent of whether the phase of said second clock input signal is leading or lagging the phase of said first clock input signal.

11. The integrated circuit, as recited in claim 7, wherein the PHD is self-initializing.

12. The integrated circuit, as recited in claim 7, wherein said first clock input signal is a clock reference signal and said second clock input signal is an oscillator clock signal.

* * * * *